US007416944B2

(12) United States Patent
Kim

(10) Patent No.: US 7,416,944 B2
(45) Date of Patent: Aug. 26, 2008

(54) FLASH EEPROM DEVICE AND METHOD FOR FABRICATING THE SAME

(75) Inventor: Heung Jin Kim, Choongcheongbuk-do (KR)

(73) Assignee: Dongbu Electronics Co., Ltd., Seoul (KR)

( * ) Notice: Subject to any disclaimer, the term of this patent is extended or adjusted under 35 U.S.C. 154(b) by 39 days.

(21) Appl. No.: 11/319,484

(22) Filed: Dec. 29, 2005

(65) Prior Publication Data

US 2006/0145239 A1 Jul. 6, 2006

(30) Foreign Application Priority Data

Dec. 30, 2004 (KR) ..................... 10-2004-0116742

(51) Int. Cl.
*H01L 21/336* (2006.01)

(52) U.S. Cl. ....................... 438/259; 438/261; 438/262; 257/317; 257/318; 257/E21.682

(58) Field of Classification Search ................. 438/261, 438/259, 262; 257/317, 318, E21.682
See application file for complete search history.

(56) References Cited

U.S. PATENT DOCUMENTS 5,635,415 A 6/1997 Hong
6,221,718 B1 * 4/2001 Hong ......................... 438/264
6,599,680 B2 * 7/2003 Lin ............................ 430/314
2002/0142546 A1 * 10/2002 Kouznetsov et al. ........ 438/257

* cited by examiner

*Primary Examiner*—W. David Coleman
*Assistant Examiner*—Su C Kim
(74) *Attorney, Agent, or Firm*—McKenna Long & Aldridge LLP

(57) ABSTRACT

In a flash EEPROM device, and method for fabricating the same, no bit line contact is made, thereby minimizing a design rule between a contact and a gate. Thus, cell size may be reduced. The flash EEPROM device includes a semiconductor substrate having an active area defined in a bit line direction and a word line direction, a plurality of floating gates formed in the word line direction, an interlayer polysilicon oxide film formed on a floating gate, a control gate formed on the interlayer polysilicon oxide film, source and drain electrodes disposed between adjacent floating gates in the word line direction, a buried $N^+$ region formed in the semiconductor substrate under the source and drain electrodes, and a metal silicide film formed on an upper surface of the control gate.

5 Claims, 7 Drawing Sheets bit line direction word line direction 43 42a 33a 44 42 41 39 38 31 word line direction
bit line direction
39
31
38
32
36
34
35
33
32 bit line direction word line direction bit line direction word line direction word line direction
bit line direction
44
42
41
39
38
31
43
42a
33a

FLASH EEPROM DEVICE AND METHOD FOR FABRICATING THE SAME

This application claims the benefit of Korean Patent Application No. 10-2004-0116742, filed on Dec. 30, 2004, which is hereby incorporated by reference for all purposes as if fully set forth herein.

BACKGROUND OF THE INVENTION

1. Field of the Invention

The present invention relates to a flash EEPROM device enabling a reduced cell size and to a method for fabricating the same.

2. Discussion of the Related Art

Read-only memory (ROM) devices are generally non-volatile memory devices and include programmable ROM (PROM) devices that are electrically programmed after fabrication, mounting, and packaging. In an erasable/programmable ROM (EPROM) device, the programmed data can be erased using ultraviolet light, and in an electrically erasable PROM (EEPROM) device, the programmed data can be erased electrically. A flash memory device, which may be constructed as a NAND or NOR device, is a volatile memory device enabling multiple data rewrite operations electrically.

The programming and erasing of a flash memory device is performed by charging and discharging a floating gate using, for example, channel hot electron injection and Fowler-Nordheim tunneling. In the programming of a memory cell of a flash memory device, such as, a memory cell transistor, a high voltage is applied to the control gate to inject, into the floating gate, electrons from a substrate region near a drain of a memory cell. The transistor's threshold voltage is thereby raised as the injected electrons accumulate in the floating gate. Programming occurs when a predetermined amount of accumulation is reached, such that a logic "1" or a logic "0" is stored in the cell, which can be read by detecting a source-drain current.

After repeated write/erase cycles, the reliability of a flash memory cell becomes degraded over time, and generally deteriorates more quickly in NOR flash devices, according to a deterioration of a tunneling oxide, i.e., a silicon oxide film formed on a source/drain diffusion layer. The deterioration is specifically due to the flow of tunnel current during charging and discharging. In generating tunnel current, a high-voltage electric field (e.g., greater than 8 MV/cm) is applied across the silicon oxide film, creating electron-hole traps in the film and thus facilitating leakage current through the film. This is particularly problematic for a silicon oxide film of 10 nm or thinner.

FIG. 1 illustrates a flash EEPROM device according to a related art. The device comprises a semiconductor substrate 11 in which active and inactive regions are defined by a device isolation film 12; a floating gate 14, formed over the active region, interposing a tunneling oxide film 13; a gate insulating film 15 formed on the floating gate 14; a control gate 16 formed on the gate insulating film 15; sidewall spacers 17 disposed on the lateral sides of each of the floating gate 14 and the control gate 16; source/drain regions 18 formed in a surface of the semiconductor substrate Ion opposite sides of the floating gate 14; an interlayer insulating film 19, formed on an entire surface of the semiconductor substrate 11, in which contact holes are formed to expose pad areas of the source/drain regions 18; and a bit line 20 formed on the interlayer insulating film 19 and connected to the source/drain regions 18 through the contact holes. The above flash EEPROM device has a structure in which two adjacent cells fan out for one bit line contact having a common source line.

Due to a limitation in a design rule, however, there is a limitation in reducing the size of the cell or layout area. The design rule is limited by the bit line contact with the source/drain regions 18. Cell-to-cell isolation requires a device isolation film, which may be formed by shallow-trench isolation or local oxidation of silicon. The device isolation film requires a finite dimension to prevent punch-through, which represents another impediment to cell size reduction. Here, the size of the device isolation film is in general greater than the gate-to-gate design rule.

SUMMARY OF THE INVENTION

Accordingly, the present invention is directed to a flash EEPROM device and a method for fabricating the same that substantially obviates one or more problems due to limitations and disadvantages of the related art.

An advantage of the present invention is to provide a flash EEPROM device and a method for fabricating the same, by which a reduced cell size is enabled.

Another advantage of the present invention is to provide a flash EEPROM device and a method for fabricating the same, which minimizes a design rule between a contact and a gate by eliminating a bit line contact area.

Additional features and advantages of the invention will be set forth in the description which follows, and will be apparent from the description, or may be learned by practice of the invention. The objectives and other advantages of the invention will be realized and attained by the structure and method particularly pointed out in the written description and claims hereof as well as the appended drawings.

To achieve these and other advantages and in accordance with the purpose of the present invention, as embodied and broadly described, a flash EEPROM device comprises a semiconductor substrate having an active area defined in a bit line direction and a word line direction, a plurality of floating gates formed on the active area of the semiconductor substrate in the word line direction, an interlayer polysilicon oxide film formed on at least one of the plurality of floating gates, a control gate formed on the interlayer polysilicon oxide film, source and drain electrodes disposed between adjacent floating gates in the word line direction, a buried $N^+$ region formed in the semiconductor substrate under the source and drain electrodes, and a metal silicide film formed on an upper surface of the control gate.

According to another aspect of the present invention, a method for fabricating a flash EEPROM device includes forming a tunneling oxide film on an active region of a semiconductor substrate defined in a bit line direction and a word line direction, forming a first conductive layer and a first insulating film on the tunneling oxide film, selectively patterning the first insulating film and the first conductive layer formed in the word line direction, forming sidewall spacers at opposite sides of the first insulating film and the patterned first conductive layer, forming a buried $N^+$ region in an exposed surface of the semiconductor substrate, forming a second conductive layer on an entire surface of the semiconductor substrate by a planarizing process, to form source and drain electrodes on the buried $N^+$ region, removing the first insulating film and forming a second insulating film on a surface of the source and drain electrodes, sequentially forming an interlayer polysilicon oxide film and a third conductive layer on an entire surface of the semiconductor substrate, forming a control gate and a floating gate by selectively patterning the third conductive layer, the interlayer polysilicon oxide film, and the first conductive layer formed in the bit line direction of the semiconductor substrate, forming a third insulating film on an entire surface of the semiconductor substrate by planarizing an entire surface of the semiconductor surface until the control gate is reached; and forming a metal silicide film on a surface of the floating gate.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate exemplary embodiment(s) of the invention and together with the description serve to explain the principles of the invention. In the drawings.

DETAILED DESCRIPTION OF THE INVENTION

Reference will now be made in detail to exemplary embodiments of the present invention, examples of which are illustrated in the accompanying drawings. Wherever possible, like reference designations will be used throughout the drawings to refer to the same or similar parts.

Figure 2A:
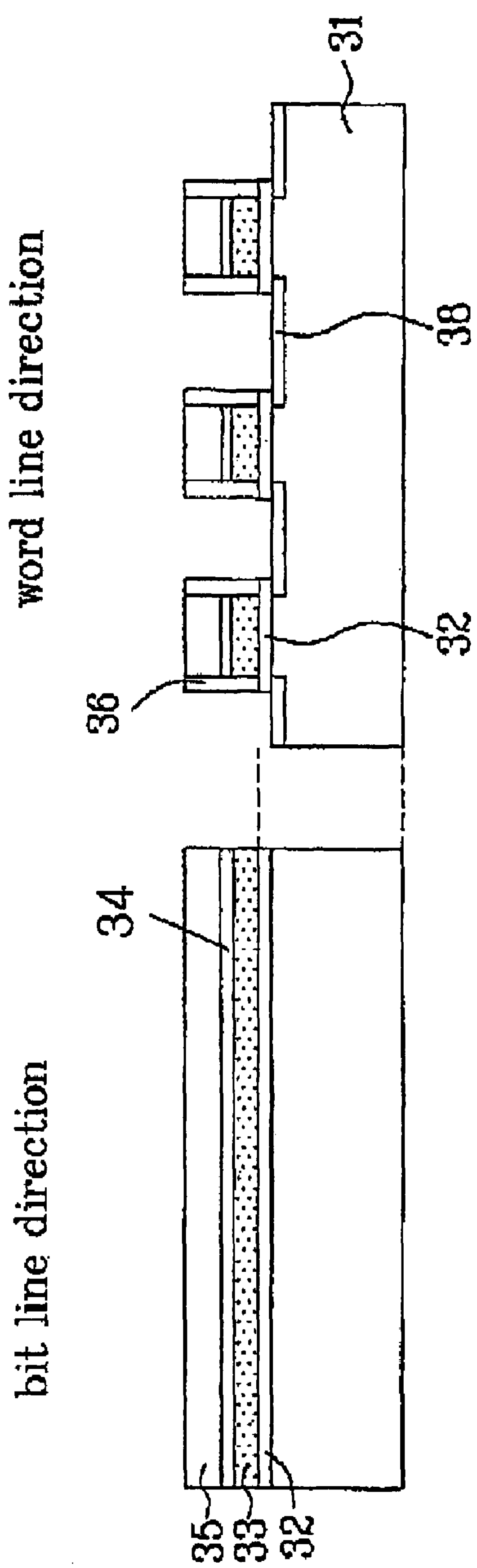
FIGS. 2A-2F are cross-sectional views of a flash EEPROM device according to the present invention fabricated by a method according to the present invention.

Referring to FIG. 2A, a tunneling oxide film 32 is formed on an active region of a semiconductor substrate 31 defined according to a bit line direction and a word line direction, respectively. For floating gate formation, a first polysilicon film 33 and a nitride film 34 are formed on the tunneling oxide film 32. A layer of photoresist is formed on the nitride film 34 and is patterned by exposure and development processes to form a photoresist pattern 35, which is used as a mask in selectively etching and patterning the nitride film 34, the first polysilicon film 33, and the tunneling oxide film 32 in the word line direction. A buried $N^+$ region 38 is formed of $N^+$ impurity ions injected into the exposed surfaces of the semiconductor substrate 31 to be disposed under source and drain electrodes, which are subsequently formed. Then, sidewall spacers 36 are formed at the sides of each of the patterns of nitride film 34, the first polysilicon film 33, and the tunneling oxide film 32.

Figure 2B:
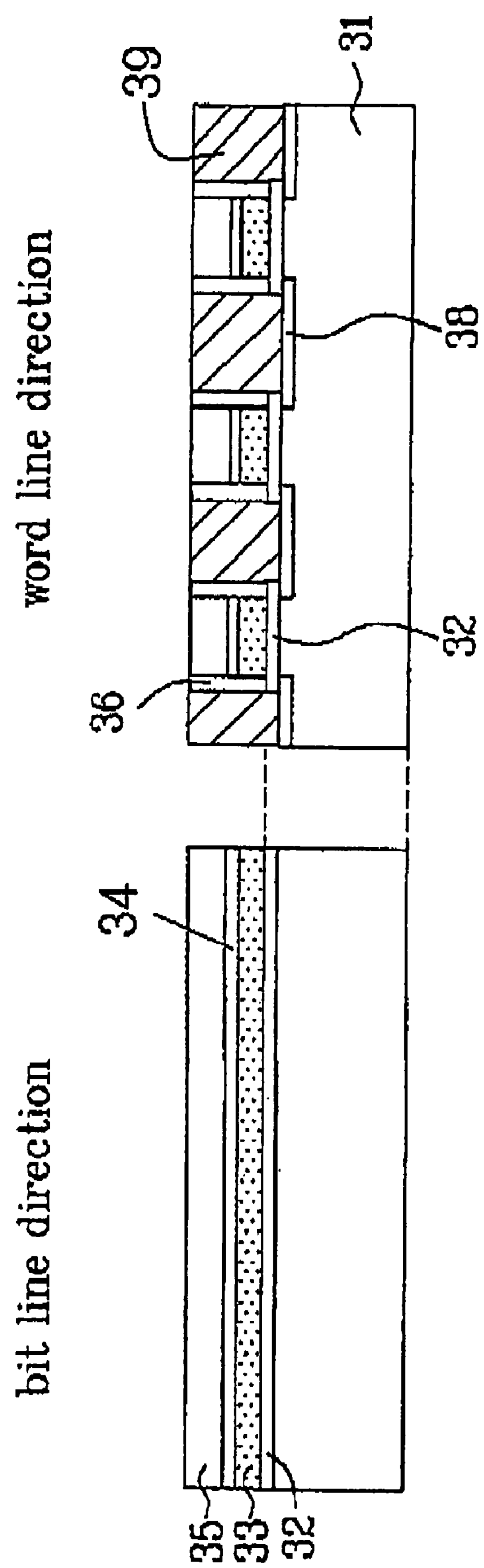

Referring to FIG. 2B, a second polysilicon film is formed on an entire surface of the semiconductor substrate 31. Chemical-mechanical polishing is performed until a surface of the photoresist pattern 35 is reached, to form source and drain electrodes 39 at the buried $N^+$ region 38.

Figure 2C:
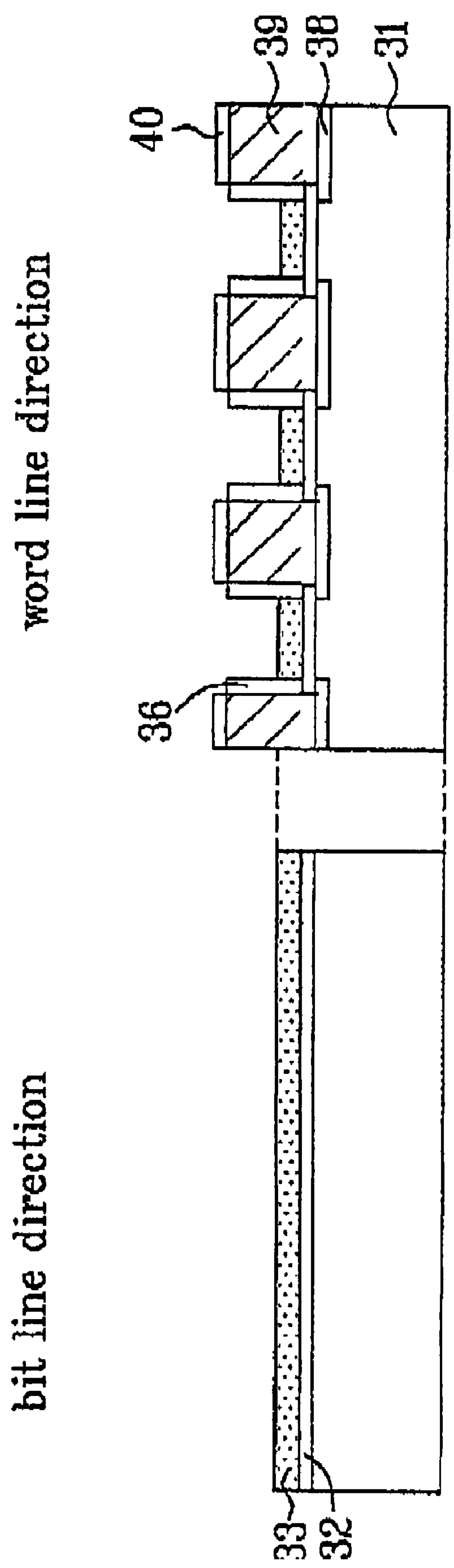

Referring to FIG. 2C, the photoresist pattern 35 and the nitride film 34 are removed. An oxidation process is performed to the source and drain electrodes 39 to form a gate insulating film 40 on an upper surface of the source and drain electrodes.

Figure 2D:
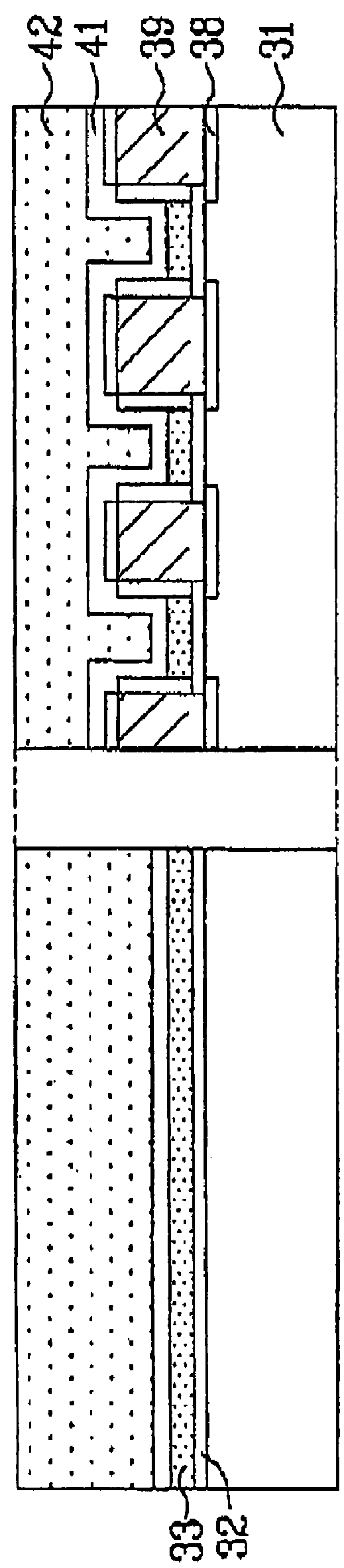

Referring to FIG. 2D, an interlayer polysilicon oxide film 41 is formed on an entire surface of the semiconductor substrate 31 and is thus disposed between the source and drain electrodes 39. A third polysilicon film 42 for control gate formation is formed on the interlayer polysilicon oxide film 41.

Figure 2E:
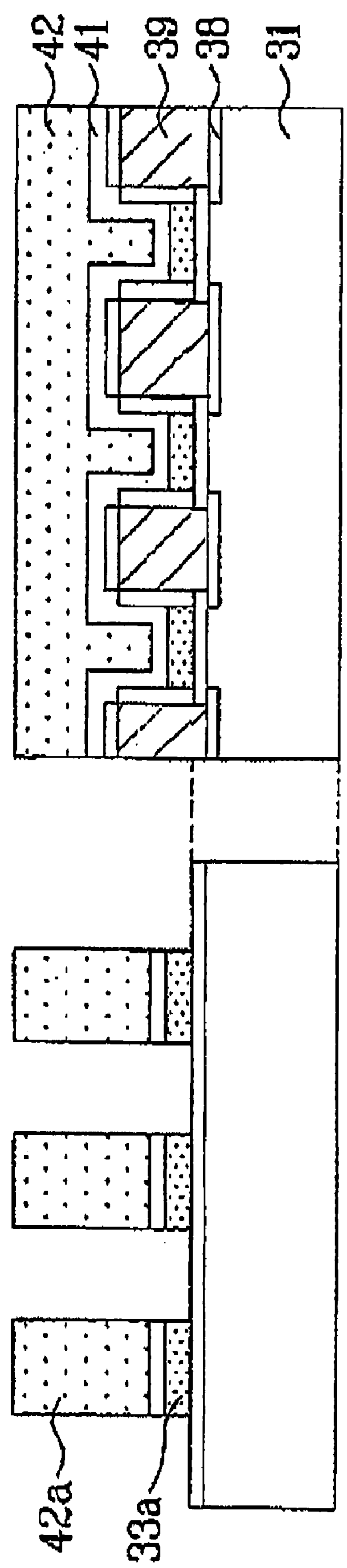

Referring to FIG. 2E, the third polysilicon film 42, the interlayer polysilicon oxide film 41, and the first polysilicon film 33 are patterned in the bit line direction by a photo-etching process, to form a control gate 42*a* and a floating gate 33*a*. Thus, the control gate 42*a* in the word line direction of the semiconductor substrate 31 is formed on the floating gate 33*a*. The interlayer polysilicon oxide film 41 is formed on the floating gate 33*a* and the control gate 42*a* is formed on the interlayer polysilicon oxide film 41.

Figure 2F:
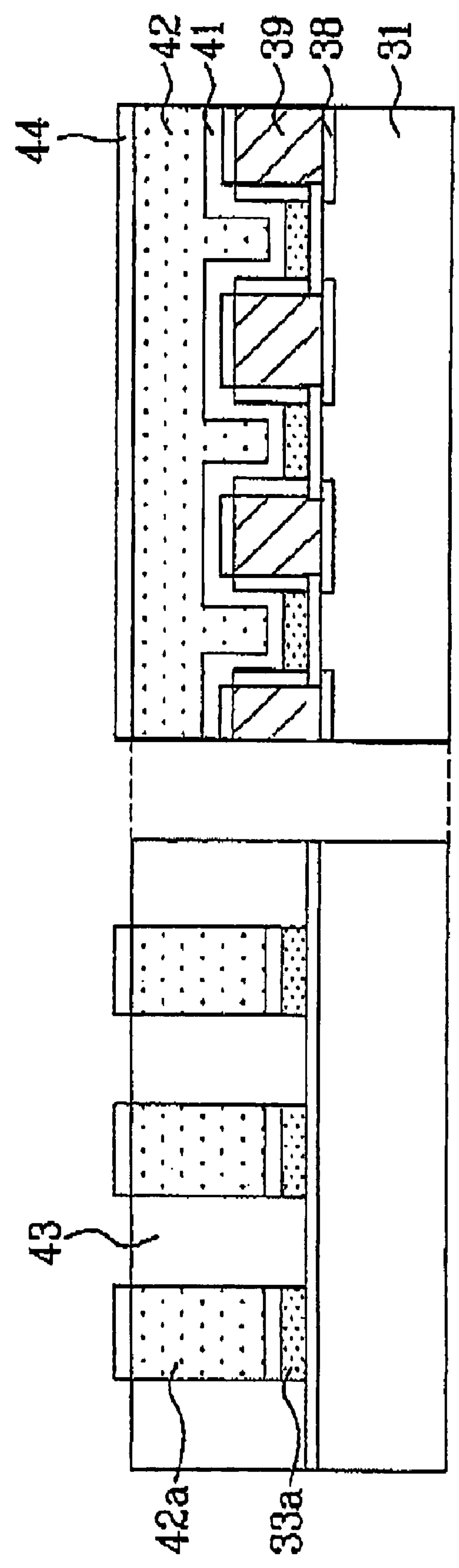

Referring to FIG. 2F, an insulating film 43 is formed on an entire surface of the semiconductor substrate 31, and chemical-mechanical polishing is performed until the control gate 42*a* is reached. Then, a metal film, such as cobalt or titanium, is deposited on the planarized surface and is heat treated to form a metal silicide film 44 on an upper surface of the control gate 42*a*. The metal film that has not reacted with the control gate 42*a* is removed by wet etching. The EEPROM cell is completed by forming contacts and wiring according to known processing.

Figure 1:
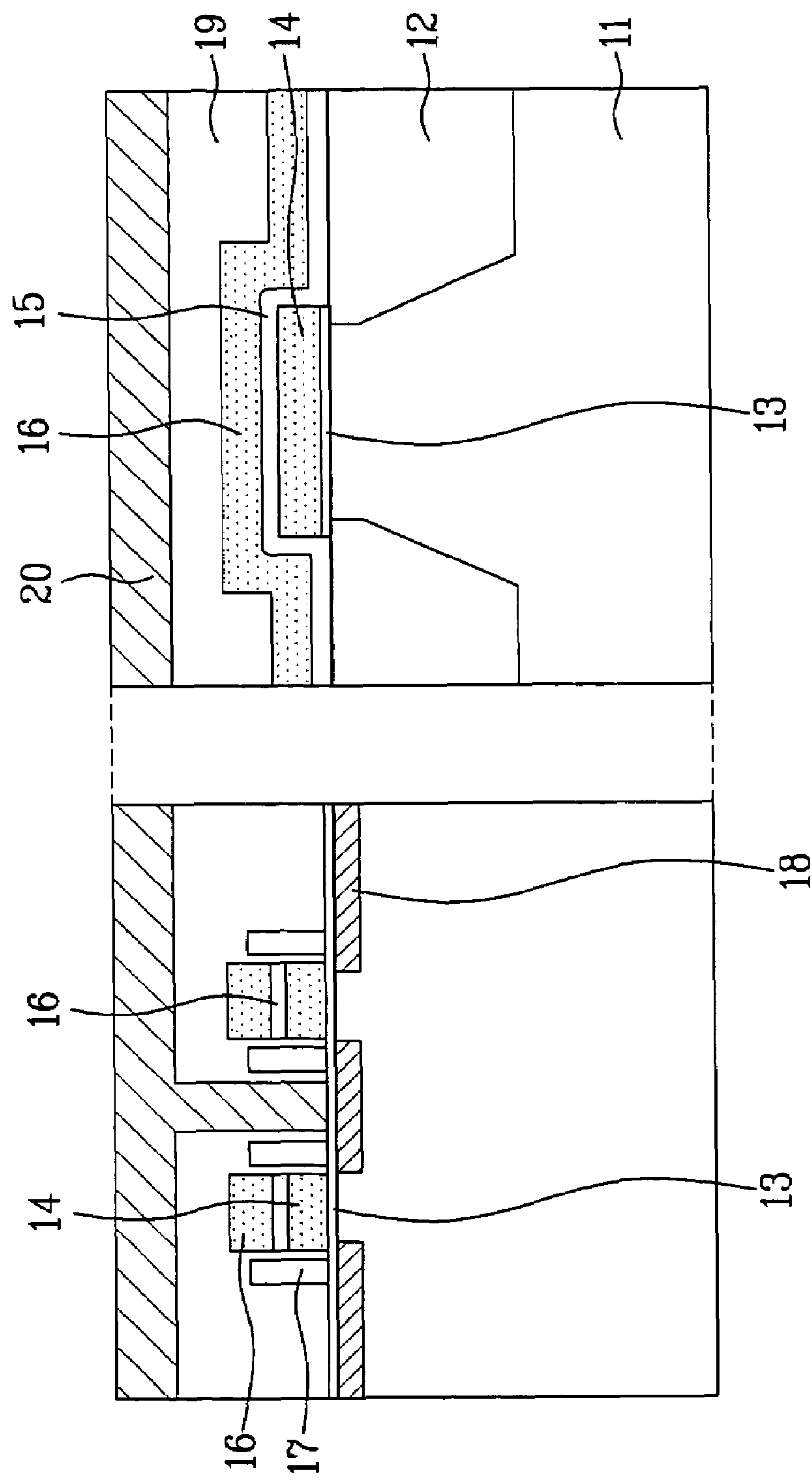
FIG. 1 is a cross-sectional view of a related art flash EEPROM device.

According to the flash EEPROM and method for fabricating the same, the electrodes at the drain/source regions enable a lower active resistance. Thus, a high-density NOR flash device may be enabled without bit line contacts by commonly forming drain contacts in the NOR cells. The formation of common drain lines and source lines enables the cell formation in a word line direction and in the bit line contact direction of the device shown in FIG. 1. Thus, the need for isolation using a device isolation film is obviated, thereby enabling a reduced cell size. Formation of the gate oxide film only on the active region secures good endurance and drain disturbance characteristics through use of a tunnel gate oxide film of uniform and good quality. Programming is achievable with a smaller layout area by overlapping the control gate and the floating gate with the drain electrode. Also, short channel effects are reduced by securing a channel margin in a shadow junction.

It will be apparent to those skilled in the art that various modifications and variations can be made in the present invention without departing from the spirit or scope of the invention. Thus, it is intended that the present invention cover the modifications and variations of this invention provided they come within the scope of the appended claims and their equivalents.

What is claimed is:

1. A method for fabricating a flash EEPROM device, comprising:

forming a tunneling oxide film on an active region of a semiconductor substrate defined in a bit line direction and a word line direction;

forming a first conductive layer and a first insulating film on the tunneling oxide film;

depositing a layer of photoresist on the first insulating film;

patterning and developing the layer of photoresist to form a photoresist pattern;

selectively patterning the first insulating film, the first conductive layer and the tunneling oxide film formed in the word line direction, by selectively etching the first insulating film, the first conductive layer and the tunneling oxide film using the photoresist pattern as a mask;

forming a buried N+ region in an exposed surface of the semiconductor substrate;

subsequently forming sidewall spacers at opposite sides of the patterned first insulating film, the patterned first conductive layer and the tunneling oxide film;

forming a second conductive layer on an entire surface of the semiconductor substrate, to form source and drain electrodes on the buried N+ region by a planarizing process;

removing the photoresist pattern and the first insulating film and forming a second insulating film on a surface of the source and drain electrodes;

sequentially forming an interlayer polysilicon oxide film and a third conductive layer on an entire surface of the semiconductor substrate including opening between the sidewall spacers;

forming a control gate and a floating gate by selectively patterning the third conductive layer, the interlayer polysilicon oxide film, and the first conductive layer formed in the bit line direction of the semiconductor substrate;

forming a third insulating film on an entire surface of the semiconductor substrate by planarizing an entire surface of the semiconductor surface until the control gate is reached; and forming a metal silicide film on a surface of the control gate.

2. The method of claim 1, wherein the step of forming a metal silicide film comprises:

depositing a metal film on the planarized surface of the semiconductor substrate; and heat treating the metal film.

3. The method of claim 2, wherein the metal film is selected from a group consisting of cobalt and titanium.

4. The method of claim 1, wherein the first insulating film is a nitride film.

5. The method of claim 1, wherein the first conductive layer is a polysilicon film.

* * * * *